(12) United States Patent
Chen et al.

(10) Patent No.: US 7,847,364 B2
(45) Date of Patent: Dec. 7, 2010

(54) FLEXIBLE PHOTO-DETECTORS

(75) Inventors: Gang Chen, Basking Ridge, NJ (US);
Ashok J. Maliakal, Westfield, NJ (US);
Oleg Mitrofanov, New Haven, CT (US);
Ronen Rapaport, Millburn, NJ (US);
Nikolai Zhitenev, Berkeley Heights, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 627 days.

(21) Appl. No.: 11/824,667

(22) Filed: Jul. 2, 2007

(65) Prior Publication Data
US 2009/0014825 A1    Jan. 15, 2009

(51) Int. Cl.
*H01L 29/00* (2006.01)
(52) U.S. Cl. .............. 257/458; 257/432; 257/E31.093; 438/69; 438/82
(58) Field of Classification Search ............ 257/40, 257/432, 458, E31.093; 438/69, 82
See application file for complete search history.

(56) References Cited

U.S. PATENT DOCUMENTS

| | | | | |
|---|---|---|---|---|
| 4,222,903 | A | 9/1980 | Heeger et al. | 252/518 |
| 4,481,132 | A | 11/1984 | Dubois et al. | 252/519 |
| 5,179,035 | A | 1/1993 | Shannon | 437/51 |
| 6,303,943 | B1 * | 10/2001 | Yu et al. | 257/40 |
| 7,166,412 | B2 | 1/2007 | Park et al. | 430/270.1 |
| 2004/0067324 | A1 | 4/2004 | Lazarev et al. | 428/1.31 |
| 2006/0013549 | A1 | 1/2006 | Shtein et al. | 385/128 |
| 2006/0032529 | A1 | 2/2006 | Rand et al. | 136/263 |
| 2007/0019917 | A1 * | 1/2007 | Bayindir et al. | 385/123 |

FOREIGN PATENT DOCUMENTS
WO    WO 2007/130025 A1    11/2007

OTHER PUBLICATIONS

Aug. 1, 2006, Curran, S., et al., "Cascade Solar Cell Increases Efficiency", Proceedings of the International Society for Optical Engineering—SPIE; Bellingham, Virginia; XP007901691; pp. 1-2.
Jun. 14, 2007, "Photodiode", pp. 1-5, downloaded from http://en.wikipedia.org/wiki/Photodiode.
Radhakrishnan, T., "Renaissance of the Plastic Age"—Discoverers of Conducting Polymers Honoured with the Millenium Nobel Prize in Chemistry, Resonance, Feb. 2001, pp. 62-70.

(Continued)

*Primary Examiner*—Zandra Smith
*Assistant Examiner*—Christy L Novacek
(74) *Attorney, Agent, or Firm*—The Law Office of Jay M. Brown

(57) ABSTRACT

Apparatus including flexible line extending along a length. Flexible line includes first charge carrier-transporting body, photosensitive body over first charge carrier-transporting body, and second charge carrier-transporting body over photosensitive body. Each of first and second charge carrier-transporting bodies and photosensitive body extend along at least part of length of flexible line. Photosensitive body is capable of near-infrared or visible light-induced generation of charge carrier pairs. Second charge carrier-transporting body is at least semi-transparent to near-infrared light or visible light.

20 Claims, 4 Drawing Sheets

OTHER PUBLICATIONS

Apr. 17, 2003, Yang et al., "Improvement of Color Purity in Blue-Emitting Polyfluorene by Copolymerization with Dibenzothiophene", J. Mater. Chem., vol. 13, pp. 1351-1355 (2003).

Mar. 15, 2005, Holt et al., "Solid-State Electrochromic Devices Based on Poly(phenylene vinylene) Polymers", Applied Physics Letters, vol. 86, pp. 123504-1 through 123504-3 (2005).

2005, Barber et al., "Organic Photocells Based on Block Copolymer / C60 Blends'" Laboratory for Physical Sciences and Department of Electrical and Computer Engineering, University of Maryland; 12pp.; downloaded from http://www.nanocenter.umd.edu/nanoday/2006/posters/SPIE_2005-304-04-24-06.pdf.

Jun. 13, 2007, Electronic Polymers, Semiconducting Polymers and Light Emitting Polymers—Focus on Polythiophene by Sigma-Aldrich; 5pp.; downloaded from http://www.azom.com/details.asp?ArticleID=2772.

Pub. Date unknown, Nozik, A., "Electron Transfer Dynamics Across Semiconductor-Molecule Interfaces and Size Quantization Effects in Semiconductors," 6 pp., downloaded from http://www.colorado.edu/chem/people/nozika.html.

"Titanium Dioxide Band Structure," (undated; downloaded on May 14, 2010), published on-line by the Tyndall National Institute, 3 pages, "Lee Maltings", Dyke Parade, Cork, Ireland, at http://www.tyndall.ie/research/electronic-theory-group/cm4105/bandstructs/TiO2_b.pdf.

"Quantum Dot," (undated; downloaded on May 14, 2010), 10 pages, published on-line at http://en.wikipedia.org/wiki/Quantum_dot.

* cited by examiner

FLEXIBLE PHOTO-DETECTORS

BACKGROUND OF THE INVENTION

1. Field of the Invention

This invention generally relates to photo-detectors.

2. Related Art

Various types of photo-detector devices have been developed that are capable of converting light into electrical current for detection of the light. Photo-detector devices for converting light into electrical current have taken advantage of various materials capable of light-stimulated generation of charge carrier pairs. Given the myriad end-utilization applications for photo-detectors, there is a continuing need for new devices and methods capable of detecting light, which may facilitate further exploitations of materials capable of light-stimulated generation of charge carrier pairs.

SUMMARY

In an example of an implementation, an apparatus is provided that includes a flexible line extending along a length, the flexible line including: a first charge carrier-transporting body extending along at least a part of the length of the flexible line; a photosensitive body over the first charge carrier-transporting body and extending along at least a part of the length of the flexible line, the photosensitive body capable of near-infrared light-induced or visible light-induced generation of charge carrier pairs; and a second charge carrier-transporting body over the photosensitive body and extending along at least a part of the length of the flexible line, the second charge carrier-transporting body being at least semi-transparent to near-infrared light or visible light.

As another example of an implementation, a method is provided that includes providing a flexible line extending along a length, the flexible line including a first charge carrier-transporting body, a photosensitive body over the first charge carrier-transporting body, and a second charge carrier-transporting body over the photosensitive body, each of the first and second charge carrier-transporting bodies and the photosensitive body extending along at least a part of the length of the flexible line, the photosensitive body being capable of near-infrared light-induced or visible light-induced generation of charge carrier pairs, and the second charge carrier-transporting body being at least semi-transparent to near-infrared light or visible light. The method also includes forming an electrical circuit including the first and second charge carrier-transporting bodies and the photosensitive body, and a current detector. The method further includes detecting current generated by exposure of the flexible line to near-infrared light or visible light.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

DETAILED DESCRIPTION

An apparatus is provided that includes a flexible line extending along a length. The flexible line includes a first charge carrier-transporting body extending along at least a part of the length of the flexible line. The flexible line also includes a photosensitive body over the first charge carrier-transporting body and extending along at least a part of the length of the flexible line. The flexible line further includes a second charge carrier-transporting body over the photosensitive body and extending along at least a part of the length of the flexible line. The photosensitive body is capable of near-infrared light-induced or visible light-induced generation of charge carrier pairs. The second charge carrier-transporting body is at least semi-transparent to near-infrared light or visible light.

Figure 1:
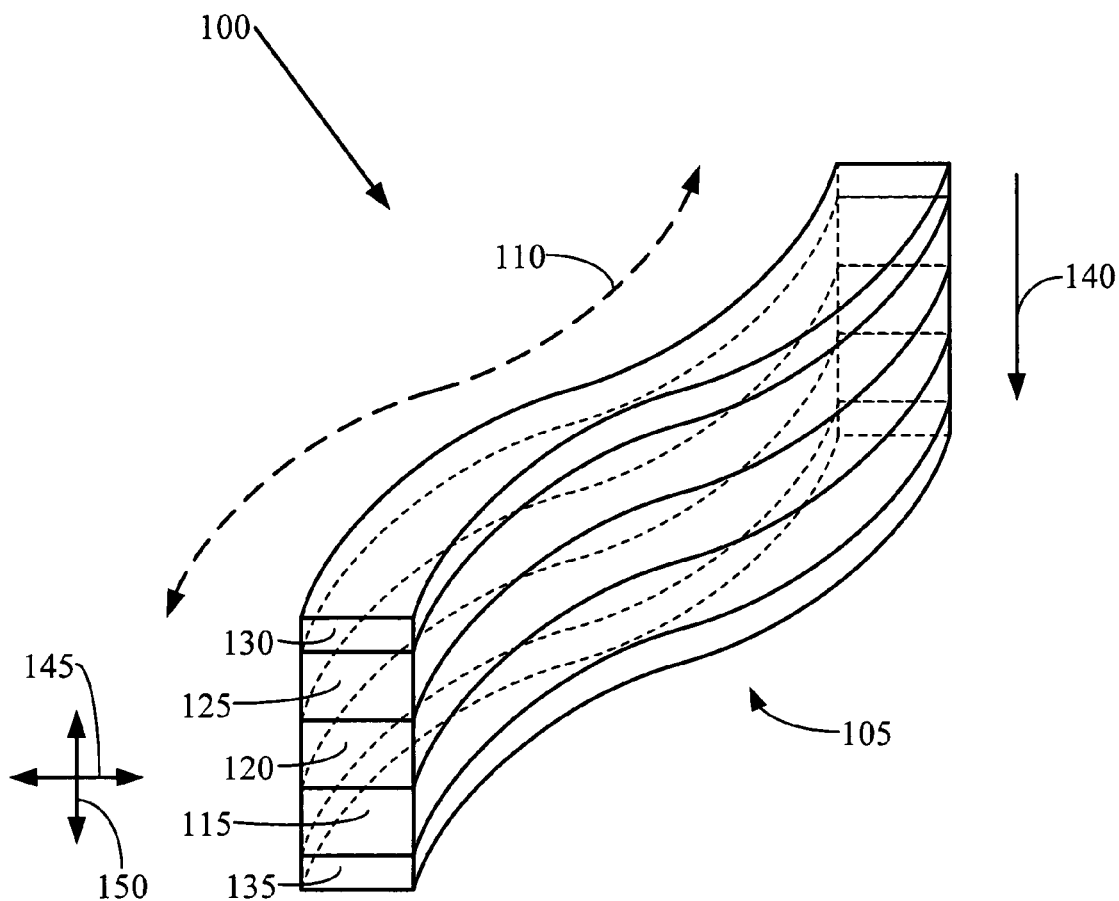
FIG. 1 is a perspective view showing an example of an apparatus.

FIG. 1 is a perspective view showing an example of an apparatus 100. The apparatus 100 includes a flexible line 105 extending along a length indicated by the dotted line 110. The flexible line 105 includes a first charge carrier-transporting body 115 extending along at least a part of the length 110 of the flexible line 105. The flexible line 105 also includes a photosensitive body 120 over the first charge carrier-transporting body 115 and extending along at least a part of the length 110 of the flexible line 105. The photosensitive body 120 is capable of near-infrared light-induced or visible light-induced generation of charge carrier pairs. The flexible line 105 further includes a second charge carrier-transporting body 125 over the photosensitive body 120 and extending along at least a part of the length 110 of the flexible line 105. The second charge carrier-transporting body 125 is at least semi-transparent to near-infrared light or visible light. In an example, the flexible line 105 may include a conductor 130 over the second charge carrier-transporting body 125 and extending along at least a part of the length 110 of the flexible line 105. The conductor 130 is at least semi-transparent to near-infrared light or visible light. As another example, the flexible line 105 may include a conductor 135, the first charge carrier-transporting body 115 being over the conductor 135, the conductor 135 extending along at least a part of the length 110 of the flexible line 105. As another example, the flexible line 105 may include a protective layer (not shown) over part or all of the flexible line 105.

The flexible line 105 may flex, with deformation along the line 110. For example, the flexible line 105 may be configured for deformation along the line 110 either in the directions of the arrow 145 or in the directions of the arrow 150, or in the directions of both of the arrows 145 and 150.

The first and second charge carrier-transporting bodies 115, 125 or if included, the conductors 130, 135, or all of the foregoing, may be connected in an electrical circuit with a detector (not shown). In an example, a bias voltage may be applied to the electrical circuit; or the bias voltage may be omitted. When light having a near-infrared wavelength or a visible wavelength enters the apparatus 100 generally in the direction of the arrow 140, creation of charge carrier pairs may generate an electrical current in the circuit that may be detected by the detector. The semi-transparent compositions of the second charge carrier-transporting body 125 and if included, the conductor 130, facilitate passage of the light into the photosensitive body 120.

It is understood throughout this specification by those skilled in the art that when a body or layer is referred to as being "on" or "over" another body or layer, that body or layer may be directly or actually on (or over) the other body or layer or, alternatively, one or more intervening bodies or layers may also be present. It is further understood that when a body or layer is referred to as being "on" or "over" another body or layer, that body or layer may cover the entire surface of the other body or layer or only a portion of the surface of the other body or layer. It is additionally understood throughout this specification by those skilled in the art that terms such as "formed on" or "formed over" are not intended to introduce any limitations relating to particular methods of material transport, deposition, fabrication, surface treatment, or physical, chemical or ionic bonding or interaction. It is further understood throughout this specification by those skilled in the art that a body or layer is said to be "transparent" when that body or layer permits at least 50% of near-infrared light or visible light or both to be transmitted through the body or layer. Similarly, it is understood throughout this specification by those skilled in the art that a body or layer is said to be "semi-transparent" when that body or layer permits some but less than 50% of near-infrared light or visible light or both to be transmitted through the body or layer.

Figure 2:
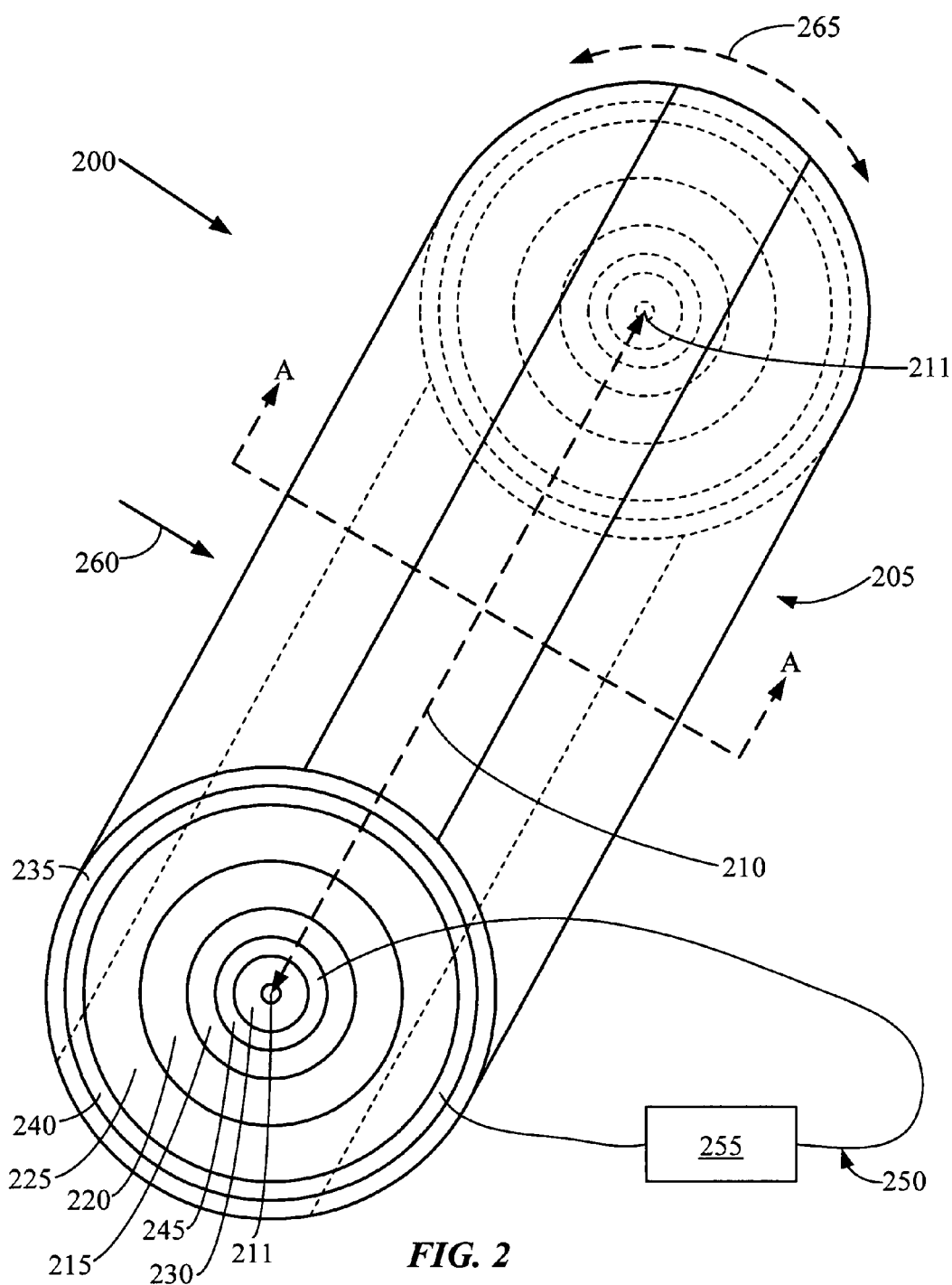
FIG. 2 is a perspective view showing another example of an apparatus.

FIG. 2 is a perspective view showing another example of an apparatus 200. The apparatus 200 includes a flexible line 205 extending along a length indicated by a dotted line 210 around a longitudinal axis 211. The flexible line 205 may, for example, include an inner charge carrier-transporting layer 215 extending along at least a part of the length 210 of the flexible line 205. The flexible line 205 may also include, as an example, a photosensitive layer 220 over the inner charge carrier-transporting layer 215 and extending along at least a part of the length 210 of the flexible line 205. The photosensitive layer 220 is capable of near-infrared light-induced or visible light-induced generation of charge carrier pairs. The flexible line 205 may further include, in an example, an outer charge carrier-transporting layer 225 over the photosensitive layer 220 and extending along at least a part of the length 210 of the flexible line 205. The outer charge carrier-transporting layer 225 is at least semi-transparent to near-infrared light or visible light. In an example, the flexible line 205 may include a fiber 230 extending along at least a part of the length 210 of the flexible line 205, the inner charge carrier-transporting layer 215 being over the fiber 230 and extending along at least a part of the length 210 of the flexible line 205. As another example, the flexible line 205 may include a protective layer 235 over the outer charge carrier-transporting layer 225 and extending along at least a part of the length 210 of the flexible line 205.

In an example, the flexible line 205 may include a conductor 240 over the outer charge carrier-transporting layer 225 and extending along at least a part of the length 210 of the flexible line 205. The conductor 240 is at least semi-transparent to near-infrared light or visible light. The protective layer 235 may be, for example, over the conductor 240. As another example, the flexible line 205 may include a conductor 245, the inner charge carrier-transporting layer 215 being over the conductor 245, the conductor 245 extending along at least a part of the length 210 of the flexible line 205.

The inner and outer charge carrier-transporting layers 215, 225 or if included as shown in FIG. 2, the conductors 240, 245, or all of the foregoing, may be connected in an electrical circuit 250 with a detector 255. In an example, a bias voltage may be applied to the electrical circuit 250; or the bias voltage may be omitted. When light having a near-infrared wavelength or a visible wavelength enters the apparatus 200 generally in the direction of the arrow 260 at any point around a circumference 265 of the flexible line 205, creation of charge carrier pairs may generate an electrical current in the circuit 250 that may be detected by the detector 255. The semi-transparent compositions of the outer charge carrier-transporting layer 225 and if included, the conductor 240, facilitate passage of the light into the photosensitive layer 220.

Figure 3:
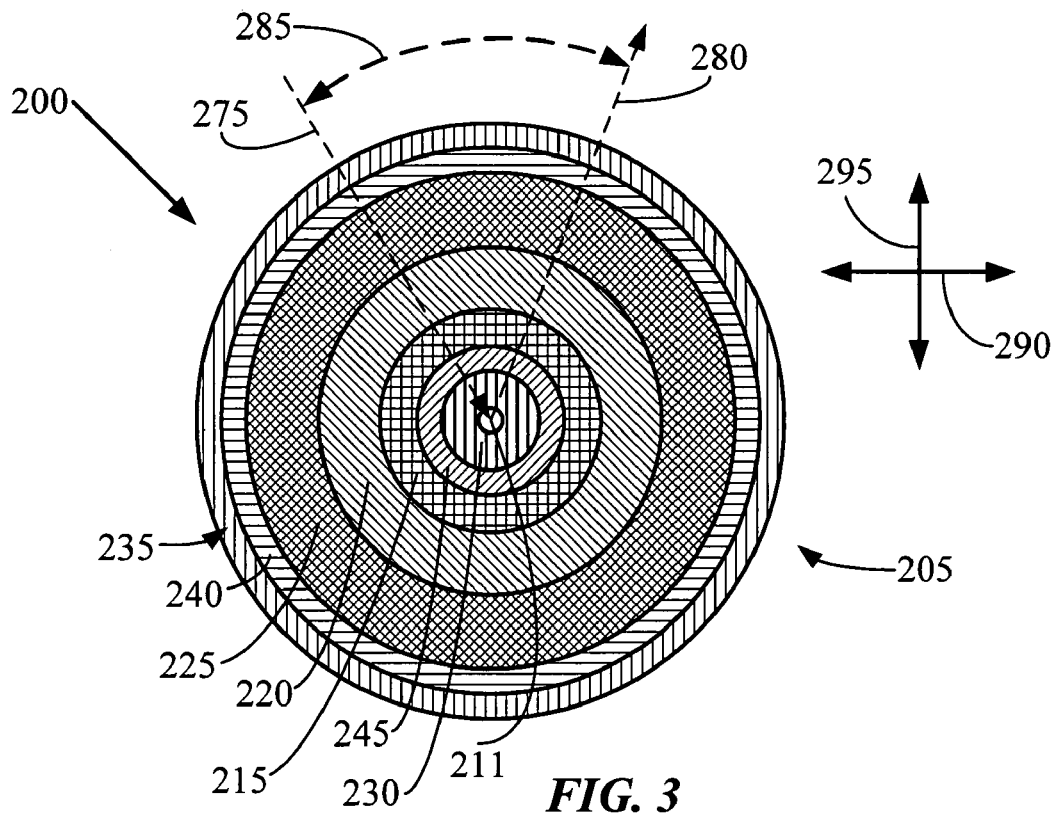
FIG. 3 is a cross-sectional view, taken along the line A-A, of the example of an apparatus shown in FIG. 2.

FIG. 3 is a cross-sectional view taken along the line A-A showing the example of an apparatus 200 in FIG. 2. FIG. 3 shows that the apparatus 200 includes a flexible line 205 and a longitudinal axis 211. The flexible line 205 may, for example, include: an inner charge carrier-transporting layer 215; a photosensitive layer 220 over the inner charge carrier-transporting layer 215; and an outer charge carrier-transporting layer 225 over the photosensitive layer 220. The flexible line 205 may further include, as an example, a fiber 230, the inner charge carrier-transporting layer 215 being over the fiber 230. As another example, the flexible line 205 may include a protective layer 235 over the outer charge carrier-transporting layer 225. In an example, the flexible line 205 may include a conductor 240 over the outer charge carrier-transporting layer 225 and extending along at least a part of the length 210 of the flexible line 205. As another example, the flexible line 205 may include a conductor 245, the inner charge carrier-transporting layer 215 being over the conductor 245, the conductor 245 extending along at least a part of the length 210 of the flexible line 205.

The inner charge carrier-transporting layer 215 may, for example, reflect near-infrared light or visible light. If included in the apparatus 200, the conductor 245 may either instead or in addition, reflect near-infrared light or visible light. Such light entering the apparatus 200 along an example direction of an arrow 275 and passing through the photosensitive layer 220 may then be reflected back through the photosensitive layer 220 along an example direction of an arrow 280. This double passage of the near-infrared or visible light through the photosensitive layer 220 may induce greater generation of charge carrier pairs than a single passage only along the direction of the arrow 275. The flexible line 205 may, as an example, be configured to reflect near-infrared light or visible light at an angle 285 to a direction of incidence along the arrow 275 to minimize destructive interference between incident and reflected light. For example, the inner charge carrier-transporting layer 215 or if present, the conductor 245, may be over a retarder layer (not shown) configured for causing a phase change such as a 45 degree phase change in reflected light. The flexible line 105 shown in FIG. 1 may likewise be adapted so that the first or second charge carrier-transporting body 115, 125 reflects near-infrared or visible light. The flexible line 405 discussed below may likewise be adapted in an analogous manner.

Although the longitudinal axis 210 is shown as a straight line in FIG. 2, the flexible line 205 may flex, with deformation of the straight line. For example, the flexible line 205 may be configured for deformation of the longitudinal axis 210 either in the directions of an arrow 290 or in the directions of an arrow 295, or in the directions of both of the arrows 290 and 295.

Features of the apparatus 200 and 400 are interchangeable; and the entirety of the discussion of the apparatus 400 below is incorporated in this discussion of the apparatus 200.

Figure 4:
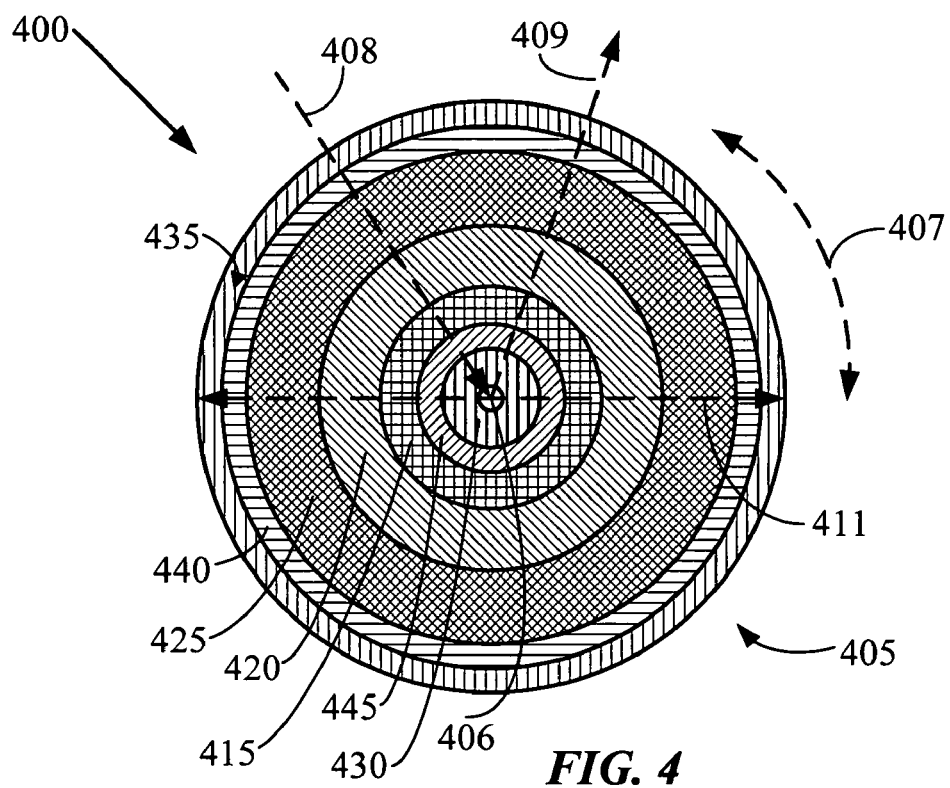
FIG. 4 is a cross-sectional view showing another example, taken along the line A-A, of the apparatus shown in FIG. 2.

FIG. 4 is a cross-sectional view showing another example 400, taken along the line A-A, of the apparatus shown in FIG.

2. FIG. 4 shows that the apparatus 400 includes a flexible line 405 and a longitudinal axis 406. The flexible line 405 may, for example, include an inner charge carrier-transporting layer 415. As an example, the inner charge carrier-transporting layer 415 may be present over the longitudinal axis 406 along only a part of a circumference 407 of the flexible line 405 between the arrows 408, 409. The flexible line 405 may further include, as examples, a photosensitive layer 420 over the inner charge carrier-transporting layer 415 and an outer charge carrier-transporting layer 425 over the photosensitive layer 420. In an example, the flexible line 405 may include a conductor 440 over the outer charge carrier-transporting layer 425 and extending along at least a part of the length of the flexible line 405. The conductor 440 is at least semi-transparent to near-infrared light or visible light. The protective layer 435 may be, for example, over the conductor 440. As another example, the flexible line 405 may include a conductor 445, the inner charge carrier-transporting layer 415 being over the conductor 445, the conductor 445 extending along at least a part of the length of the flexible line 405.

The photosensitive layer 420 and the inner and outer charge carrier-transporting layers 415, 425 may, as examples, likewise be present over the longitudinal axis 406 along only a part of a circumference 407 of the flexible line 405 between the arrows 408, 409. Likewise, if included in an apparatus 400, the conductors 440, 445 may, as examples, likewise be present over the longitudinal axis 406 along only a part of a circumference 407 of the flexible line 405 between the arrows 408, 409. The flexible line 405 may further include, as an example, a fiber 430, the inner charge carrier-transporting layer 415 being over the fiber 430. As another example, the flexible line 405 may include a protective layer 435 over the outer charge carrier-transporting layer 425. The remainders of the regions around the circumference 407 may be filled by a suitable non-conducting and non-light induced charge carrier-generating composition, for example. As another example, the remainders of the regions around the circumference 407 may be filled by the protective layer 435. The positions of the arrows 408, 409 relative to each other around the circumference 407 indicating locations of the layers 415, 420, 425, 440, 445 over the longitudinal axis 406 may be varied. As an example, such positions of the arrows 408, 409 relative to each other around the circumference 407 may be independently varied as to each of the layers 415, 420, 425, 440, 445 at a selected point along the flexible line 405 on the longitudinal axis 406. As another example, such positions of the arrows 408, 409 relative to each other around the circumference 407 may be varied as to one or more of the layers 415, 420, 425, 440, 445 at different points along the flexible line 405 on the longitudinal axis 406. In a further example, positions of the arrows 408, 409 between which one or more of the layers 415, 420, 425, 440, 445 are located may be independently varied in a spiral along the longitudinal axis 406.

A diameter of the apparatus 400 indicated by endpoints of the arrow 411 may, for example, be within a range of between about 1 micron and about 1 millimeter. The diameter of the apparatus 400 indicated by endpoints of the arrow 411 may be uniform or varied along the longitudinal axis 406. A diameter of an apparatus 200, or a width or height of an apparatus 100 in directions of the arrows 145, 150 respectively, may likewise for example be within a range of between about 1 micron and about 1 millimeter, and may likewise be uniform or varied along the length of the line 105, 205.

The inner and outer charge carrier-transporting bodies 415, 425 or if included as shown in FIG. 4, the conductors 440, 445, may be connected in an electrical circuit (not shown) with a detector (not shown), in the same manner as discussed above in connection with the apparatus 200. Features of the apparatus 200 and 400 are interchangeable; and the entirety of the discussion of the apparatus 200 is incorporated in this discussion of the apparatus 400.

The first charge carrier-transporting body 115 and the second charge carrier-transporting body 125 may, for example, each include a p-doped semiconductor or an n-doped semiconductor. Likewise, the inner charge carrier-transporting layer 215, 415 and the outer charge carrier-transporting layer 225, 425 may, for example, each include a p-doped semiconductor or an n-doped semiconductor. As examples, inorganic and organic semiconductors may be utilized. As inorganic semiconductors, compositions including elements selected from Groups III and V of the periodic table may, for example, be utilized. Poly(thiophene) is an example of a p-doping organic polymer; and a fullerene ("C60")-functionalized polymer is an example of an n-doping organic polymer. In a further example, the photosensitive body 120 or photosensitive layer 220, 420 may include a composition suitable as an intrinsic body 120 or intrinsic layer 220, 420. The flexible line 105, 205, 405 may, as an example, have a junction including the first and second charge carrier-transporting bodies 115, 125 or layers 215, 225, 415, 425 between which is the photosensitive body 120 or layer 220, 420. The first and second charge carrier-transporting bodies 115, 125 or layers 215, 225, 415, 425 and the photosensitive body 120 or layer 220, 420 may then together form a junction selected from a p-i-n junction, an n-i-n junction, and a p-i-p junction. As to these junctions, "p" indicates a p-doped semiconductor, "n" indicates an n-doped semiconductor, and "i" indicates an intrinsic region that is generally un-doped. As additional examples, the first and second charge carrier-transporting bodies 115, 125 or layers 215, 225, 415, 425 may have compositions that are inorganic or organic conductors. In examples, the first and second charge carrier-transporting bodies 115, 125 and layers 215, 225, 415, 425 may be formed of an elemental metal or alloy, of a conductive polymer, or a mixture. In these examples, the second charge carrier-transporting body 125 or layer 225, 425 is selected to be at least semi-transparent. For example, a thin layer of indium-tin-oxide ("ITO") or of gold may be utilized. As further examples, the conductors 240, 245, 440, 445 may likewise be formed of an elemental metal or alloy, of a conductive polymer, or a mixture.

The photosensitive body 120 or layers 220, 420 are capable of near-infrared light-induced or visible light-induced generation of charge carrier pairs. In an example, the photosensitive body 120 or layers 220, 420 may have a composition including a photosensitive organic polymer capable of near-infrared light-induced or visible light-induced generation of charge carrier pairs. As examples, the photosensitive organic polymer may include a moiety selected from a paraphenylene vinylene, a fluorene, a thiophene, and mixtures of two or more of the foregoing. Examples of photosensitive organic polymers that may be utilized include poly(paraphenylene vinylene) ("PPV"), poly(fluorene), poly(thiophene), or alkoxy-substituted poly(paraphenylene vinylene) ("MEH-PPV") where "alkoxy" denotes an oxygen-bonded branched or unbranched alkyl group having 1-20 carbon atoms. By "poly(thiophene)" are meant photosensitive polymers including thiophene moieties, such as poly(3-hexyl)thiophene ("P3HT") for example. In an example, the photosensitive body 120 or layers 220, 420 may have a composition including a photosensitive organic polymer selected as capable of generating charge carrier pairs in response to being illuminated by near-infrared light or visible light having one or more selected wavelengths or ranges of wavelengths.

In another example, the photosensitive body 120 or layers 220, 420 may have a composition including a semiconductor nano-structure dispersed in a conductive polymer, the semiconductor nano-structure being capable of near-infrared light-induced or visible light-induced generation of charge carrier pairs. For example, the semiconductor nano-structure may be selected from quantum dots, quantum rods, quantum wells, and mixtures including two or more of the foregoing. Semiconductor nano-structures may also be referred to as "nano-crystals". Semiconductor nano-structures may have a composition including groups of two elements, as examples, cadmium and selenium, or zinc and selenium, or indium and arsenic, or a mixture including two or more of such groups of elements. The semiconductor nano-structures may be configured, for example, to generate charge carrier pairs in response to being illuminated by near-infrared light or visible light having one or more selected wavelengths or ranges of wavelengths. Further, for example, the conductive polymer may include a member selected from poly(aniline), poly(acetylene), poly(pyrrole), poly(3,4-ethylene dioxythiophene):poly(styrene sulfonate) ("PEDOT:PSS"), and mixtures of two or more of the foregoing. Poly(acetylene) may, for example, include an oxidative dopant such as iodine or trivalent iron ions.

A protective layer 235, 435, or as included (not shown) in an apparatus 100, may have a composition including a semi-transparent or transparent dielectric polymer suitable for forming a flexible, solid, durable covering for the flexible line 105, 205, 405. As examples, the protective layer 235, 435 or included in the apparatus 100 may be formed of poly(ethylene), poly(propylene), poly(ethylene terephthalate), or poly(styrene). It is understood by those skilled in the art that the protective layer 235, 435 where included in an apparatus 100, 200, 400, may be formed of any polymer selected as having suitable dielectric, flexibility, light transmission, and durability properties effective to isolate the apparatus 100, 200, 400 from adverse effects of the ambient environment for a given end-utilization.

A fiber 230, 430 may include, as examples, a natural or synthetic inorganic or organic fiber. In another example, the fiber 230, 430 may include more than one entwined or spun filament. For example, the fiber 230, 430 may be drawn, spun or woven from one or more natural or synthetic inorganic or organic materials. Organic materials include plant fibers and organic polymers, as examples. Inorganic materials include glass compositions such as silicon dioxide. In general, any fiber may be selected as having suitable dielectric, flexibility, and other mechanical properties such as tensile strength, for a given end-utilization.

The apparatus 100, 200, 400 may, for example, be incorporated into a fabric (not shown), forming a distributed light detector. As examples, the apparatus 100, 200, 400 may be incorporated into a garment such as a jacket, a shirt, or a vest. In further examples, the apparatus 100, 200, 400 may be incorporated into another fabric such as a tent or blanket. These garments and other fabrics may be configured for use, as examples, by soldiers and other military personnel, and by law enforcement personnel. The first and second charge carrier-transporting bodies 115, 125 or the inner and outer charge carrier-transporting layers 215, 225, 415, 425 may then be connected in an electrical circuit 250 with a detector 255. In an example (not shown), a bias voltage may be applied to the electrical circuit 250; or the bias voltage may be omitted. When light having a near-infrared wavelength or a visible wavelength enters the apparatus 100, 200, 400, creation of charge carrier pairs may generate an electrical current in the circuit 250 that may be detected by the detector 255. As an example, a soldier may wear a garment including the apparatus 100, 200, 400 with such a detector 255 as a warning when the soldier is "painted" by an enemy range finding laser. The apparatus 100, 200, 400 may for example distinguish between friends and foes by detection of a wavelength or of on-off patterning of a range finding laser or other light source. For example, the apparatus 100, 200, 400 may include a photosensitive body 120 or photosensitive layer 220, 420 configured for detecting a selected wavelength or range of wavelengths. Further, the detector 255 may be configured for signal analysis of such on-off patterning and for comparison of the patterning of detected near-infrared light or visible light with a database of patterning for range finders and other light signals of friends and foes.

Figure 5:
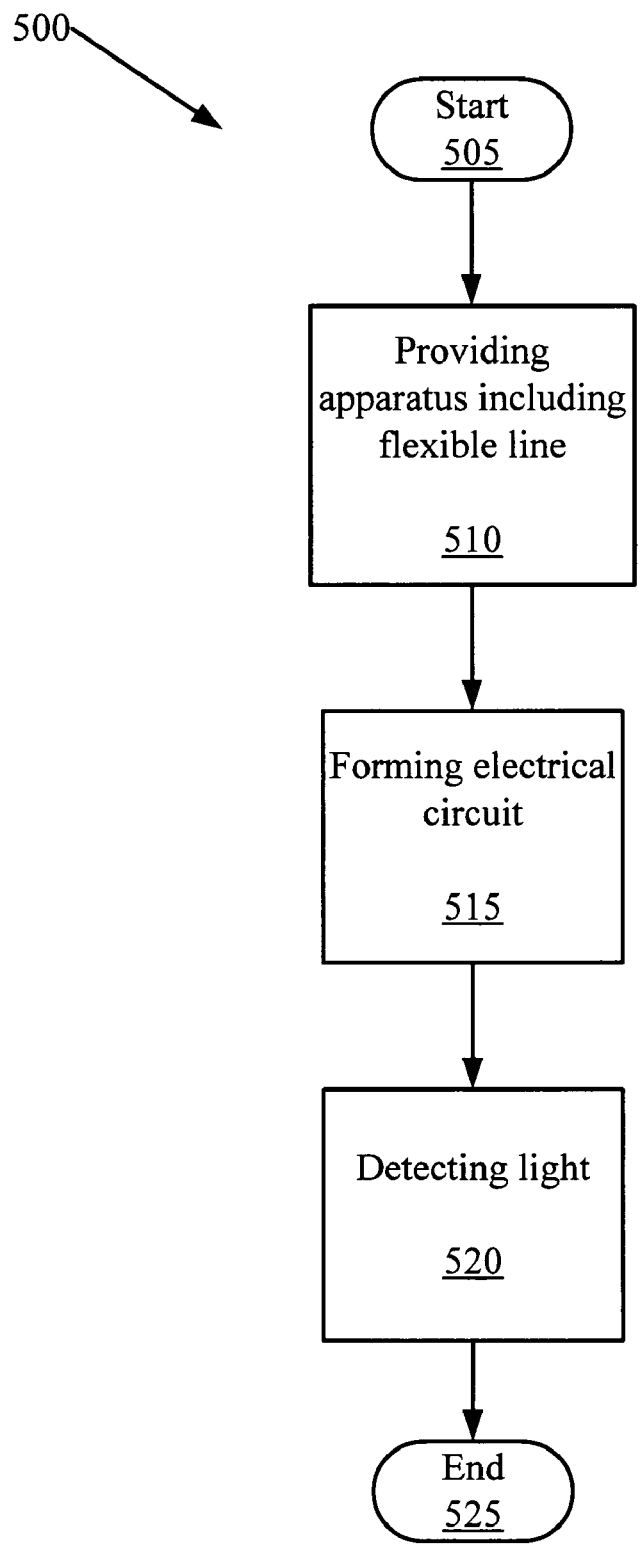
FIG. 5 is a flow chart showing a method.

FIG. 5 is a flow chart showing a method 500. The method starts at step 505, and then at step 510 an apparatus 100, 200, 400 including a flexible line 105, 205, 405 is provided, extending along a length. The flexible line 105, 205, 405 includes a first charge carrier-transporting body 115 or an inner charge carrier-transporting layer 215, 415. The flexible line 105, 205, 405 also includes a photosensitive body 120 or photosensitive layer 220, 420 over the first charge carrier-transporting body 115 or inner charge carrier-transporting layer 215, 415. The flexible line 105, 205, 405 further includes a second charge carrier-transporting body 125 or outer charge carrier-transporting layer 225, 425 over the photosensitive body or layer 120, 220, 420. Each of the first and second charge carrier-transporting bodies 115, 125 or inner and outer charge carrier transporting layers 215, 225, 415, 425 extend along at least a part of the length of the flexible line 105, 205, 405. The photosensitive body 120 or photosensitive layer 220, 420 also extends along at least a part of the length of the flexible line 105, 205, 405, and is capable of near-infrared light-induced or visible light-induced generation of charge carrier pairs. The second charge carrier-transporting body 125 or outer charge carrier-transporting layer 225, 425 is at least semi-transparent to near-infrared light or visible light. The flexible line 105, 205, 405 may further include conductors 130, 135, 240, 245, 440, 445. The entireties of the above discussions of the apparatus 100, 200, 400 may be utilized in carrying out step 510 and hereby are incorporated in this discussion of the method 500.

At step 515, an electrical circuit is formed including the first and second charge carrier-transporting bodies or inner and outer charge carrier-transporting layers and the photosensitive body or layer 115, 120, 125, 215, 220, 225, 415, 420, 425 and a current detector 250, and may include the conductors 130, 135, 240, 245, 440, 445. Current generated by exposure of the flexible line 105, 205, 405 to near-infrared light or visible light is then detected at step 520. The method 500 may then end at step 525.

The method 500 may, for example, include additional features. As an example, the flexible line 105, 205, 405 may be pre-formed, or may be fabricated as part of carrying out step 510 of the method 500. Fabrication of an apparatus 100, 200, 400 including a flexible line 105, 205, 405 may be carried out, as examples, by a process including coating, fusing, or extrusion techniques. Compositions for forming bodies or layers of apparatus 100, 200, 400 as discussed above may, for example, be dip-coated or spray-coated onto a fiber 230, 430. In another example, a first or inner charge carrier-transporting body or layer 115, 215, 415 may be pre-formed such as by a drawing or extrusion process; and then compositions for forming other bodies or layers of apparatus 100, 200, 400 as discussed above may be dip- or spray-coated or extruded onto the first or inner charge carrier-transporting body or layer 115, 215, 415. In an additional example, a perform may be fabricated including concentric layers of compositions for forming bodies or layers of apparatus 100, 200, 400 as discussed above, and the perform may be drawn or extruded to form the apparatus 100, 200, 400. An apparatus 100 may also be formed, for example, by a process that includes fusing together a plurality of performs. For example, a first perform and a second perform may be fabricated, each of the performs including a central conductor successively surrounded by a layer of a composition including an n-doped or a p-doped semiconductor for forming a first or second charge carrier-transporting body 115, 125 and then a layer of a composition for forming a photosensitive body 120. The two performs may then be fused together such as by heating them, forming a junction selected from a p-i-n junction, a n-i-n junction, or a p-i-p junction, the junction being included in the apparatus 100. As another example, the central conductors may be omitted.

The apparatus 100, 200, 400 may, for example, be utilized as a distributed light detector such as for detection of near-infrared light or visible light entering the apparatus 100, 200, 400. Likewise, the method 500 may be utilized in detecting near-infrared light or visible light. While the foregoing description refers in some instances to the apparatus 100, 200, 400, and the method 500 as shown in FIGS. 1-5, it is appreciated that the subject matter is not limited to these structures, or to the structures discussed in the specification. Other shapes and configurations of apparatus may be fabricated. Likewise, the method 500 may be performed utilizing any apparatus of which the apparatus 100, 200, 400 are examples. Further, it is understood by those skilled in the art that the method 500 may include additional steps and modifications of the indicated steps.

Moreover, it will be understood that the foregoing description of numerous examples has been presented for purposes of illustration and description. This description is not exhaustive and does not limit the claimed invention to the precise forms disclosed. Modifications and variations are possible in light of the above description or may be acquired from practicing the invention. The claims and their equivalents define the scope of the invention.

What is claimed is:

1. An apparatus, comprising:
   a flexible line extending along a length, the flexible line including:
   a first charge carrier-transporting body extending along at least a part of the length of the flexible line;
   a photosensitive body over the first charge carrier-transporting body and extending along at least a part of the length of the flexible line, the photosensitive body capable of near-infrared light-induced or visible light-induced generation of charge carrier pairs; and
   a second charge carrier-transporting body over the photosensitive body and extending along at least a part of the length of the flexible line, the second charge carrier-transporting body being at least semi-transparent to near-infrared light or visible light; and
   wherein the photosensitive body includes a conductive polymer having dispersed quantum dots or rods, the quantum dots or rods being photosensitive to visible or near-infrared light.

2. The apparatus of claim 1, wherein the flexible line includes a flexible fiber extending along at least a part of the length of the flexible line, and the first charge carrier-transporting body is an inner charge carrier-transporting layer over the fiber and extending along at least a part of the length of the flexible line.

3. The apparatus of claim 2, wherein the photosensitive body is a photosensitive layer over the inner charge carrier-transporting layer and extending along at least a part of the length of the flexible line.

4. The apparatus of claim 3, wherein the second charge carrier-transporting body is an outer charge carrier-transporting layer over the photosensitive layer and extending along at least a part of the length of the flexible line.

5. The apparatus of claim 4, wherein the fiber has a circumference at a selected point along the length of the flexible line, and the inner charge carrier-transporting layer, the photosensitive layer, and the outer charge carrier-transporting layer each are over only a part of the circumference at the point.

6. The apparatus of claim 1, wherein the first charge carrier-transporting body and the second charge carrier-transporting body each include a p-doped semiconductor or an n-doped semiconductor.

7. The apparatus of claim 6, wherein the photosensitive body is an intrinsic body, and wherein the flexible line includes a junction selected from a group consisting of a p-i-n junction, an n-i-n junction, and a p-i-p junction, the junction including the first and second charge carrier-transporting bodies and the photosensitive body.

8. The apparatus of claim 1, wherein the photosensitive body has a composition including a photosensitive organic polymer capable of near-infrared light-induced or visible light-induced generation of charge carrier pairs.

9. The apparatus of claim 8, wherein the photosensitive organic polymer includes a moiety selected from a group consisting of a paraphenylene vinylene, a fluorene, and a thiophene.

10. The apparatus of claim 1, wherein the conductive polymer includes a member selected from a group consisting of poly(aniline), poly(acetylene), poly(pyrrole), and poly(3,4-ethylene dioxythiophene):poly(styrene sulfonate).

11. A fabric including the apparatus of claim 1.

12. A method, comprising:
    providing a flexible line extending along a length, the flexible line including a first charge carrier-transporting body, a photosensitive body over the first charge carrier-transporting body, and a second charge carrier-transporting body over the photosensitive body, each of the first and second charge carrier-transporting bodies and the photosensitive body extending along at least a part of the length of the flexible line, the photosensitive body being capable of near-infrared light-induced or visible light-induced generation of charge carrier pairs, and the second charge carrier-transporting body being at least semi-transparent to near-infrared light or visible photosensitive body including a conductive polymer having dispersed quantum dots or rods, the quantum dots or rods being photosensitive to visible or near-infrared light;
    providing an electrical circuit including the first and second charge carrier-transporting bodies and the photosensitive body, and a current detector; and
    detecting current generated by exposure of the flexible line to near-infrared light or visible light.

13. The method of claim 12, wherein providing the flexible line includes providing a flexible fiber extending along at least a part of the length of the flexible line, and includes providing, as the first charge carrier-transporting body, an inner charge carrier-transporting layer over the fiber and extending along at least a part of the length of the flexible line.

14. The method of claim 13, wherein providing the flexible line includes providing, as the photosensitive body, a photosensitive layer over the inner charge carrier-transporting layer and extending along at least a part of the length of the flexible line.

15. The method of claim 14, wherein providing the flexible line includes providing, as the second charge carrier-transporting body, an outer charge carrier-transporting layer over the photosensitive layer and extending along at least a part of the length of the flexible line.

16. The method of claim 12, wherein providing the flexible line includes providing, as each of the first and second charge carrier-transporting bodies, a p-doped semiconductor or an n-doped semiconductor.

17. The method of claim 12, wherein providing the flexible line includes providing a junction selected from a group consisting of a p-i-n junction, an n-i-n junction, and a p-i-p junction, the junction including the first and second charge carrier-transporting bodies and the photosensitive body.

18. The method of claim 12, wherein the photosensitive body has a composition including a photosensitive organic polymer capable of near-infrared light-induced or visible light-induced generation of charge carrier pairs.

19. The method of claim 12, wherein the photosensitive organic polymer includes a moiety selected from a group consisting of a paraphenylene vinylene, a fluorene, and a thiophene.

20. The method of claim 12, wherein the conductive polymer includes a member selected from a group consisting of poly(aniline), poly(acetylene), poly(pyrrole), and poly(3,4-ethylene dioxythiophene):poly(styrene sulfonate).

* * * * *